(12) United States Patent
Jurik et al.

(10) Patent No.: US 10,883,704 B2
(45) Date of Patent: Jan. 5, 2021

(54) HOMOGENIZATION SYSTEM FOR AN LED LUMINAIRE

(71) Applicant: Robe Lighting s.r.o., Roznov pod Radhostem (CZ)

(72) Inventors: Pavel Jurik, Prostredni Becva (CZ); Josef Valchar, Prostredni Becva (CZ)

(73) Assignee: Robe Lighting s.r.o., Roznov pod Radhostem (CZ)

( * ) Notice: Subject to any disclaimer, the term of this patent is extended or adjusted under 35 U.S.C. 154(b) by 0 days.

(21) Appl. No.: 16/832,789

(22) Filed: Mar. 27, 2020

(65) Prior Publication Data

US 2020/0224854 A1 Jul. 16, 2020

Related U.S. Application Data

(60) Provisional application No. 62/826,544, filed on Mar. 29, 2019.

(51) Int. Cl.
*F21V 9/40* (2018.01)
*F21K 9/68* (2016.01)
(Continued)

(52) U.S. Cl.
CPC .............. *F21V 9/40* (2018.02); *F21K 9/68* (2016.08); *F21V 9/20* (2018.02); *F21V 13/08* (2013.01); *F21Y 2115/10* (2016.08)

(58) Field of Classification Search
CPC ... F21V 9/40; F21V 13/08; F21V 9/20; F21K 9/68; F21Y 2115/10
See application file for complete search history.

(56) References Cited

U.S. PATENT DOCUMENTS

| 4,386,848 | A |   | 6/1983 | Clendenin et al. |
| 5,808,800 | A | * | 9/1998 | Handschy .......... G02B 27/1033 349/11 |

(Continued)

FOREIGN PATENT DOCUMENTS

| CN | 1517783 A | 8/2004 |
| CN | 1947429 A | 4/2007 |

(Continued)

OTHER PUBLICATIONS

European Extended Search Report; Application No. 20166452.1; dated Aug. 11, 2020; 11 pages.

(Continued)

*Primary Examiner* — Tsion Tumebo
(74) *Attorney, Agent, or Firm* — Conley Rose, P. C.; Grant Rodolph; Brooks W Taylor

(57) ABSTRACT

A luminaire and light source are provided. The light source includes first, second, and third arrays of light emitting diodes (LEDs) and a beam combiner. The LEDs of the first, second, and third arrays of LEDs emit beams whose optical axes are substantially parallel. Each of the first and second arrays of LEDs produce light of two colors. The third array of LEDs produces light of a single color. Each of the arrays of LEDs includes a plurality of zones, each zone spatially separated from other zones. Each zone of the first and second arrays includes LEDs of two colors. The intensities of the LEDs of each zone are controlled independently from the LEDs of other zones. The beam combiner combines light beams from all three arrays of LEDs and produces an emitted beam of light and maintains the optical axes of the light beams as substantially parallel to each other in the emitted beam of light.

13 Claims, 13 Drawing Sheets

(51) Int. Cl.
F21V 9/20 (2018.01)
F21V 13/08 (2006.01)
F21Y 115/10 (2016.01)

(56) References Cited

U.S. PATENT DOCUMENTS

| | | | | |
|---|---|---|---|---|
| 6,331,879 | B1* | 12/2001 | Sawai | G02F 1/13362 348/E5.137 |
| 6,621,517 | B1* | 9/2003 | Squibb | G03F 9/00 348/131 |
| 6,768,526 | B2* | 7/2004 | Ho | G02B 27/1006 348/E9.027 |
| 9,885,461 | B2 | 2/2018 | Jurik et al. | |
| 10,133,080 | B2 | 11/2018 | Jurik et al. | |
| 10,371,956 | B2 | 8/2019 | Jurik et al. | |
| 2006/0291204 | A1* | 12/2006 | Marka | F21S 2/005 362/239 |
| 2009/0190346 | A1 | 7/2009 | Belliveau et al. | |
| 2012/0153852 | A1 | 6/2012 | Zhang et al. | |
| 2012/0188519 | A1* | 7/2012 | Willett | H04N 9/3138 353/31 |
| 2013/0100639 | A1 | 4/2013 | Li et al. | |
| 2014/0111985 | A1* | 4/2014 | Harbers | G01J 3/505 362/231 |
| 2014/0204586 | A1 | 7/2014 | Roberge et al. | |
| 2016/0069540 | A1 | 3/2016 | Kjeldsen et al. | |
| 2016/0131315 | A1 | 5/2016 | Zhang et al. | |
| 2016/0298827 | A1* | 10/2016 | Jurik | G02B 27/141 |
| 2017/0069612 | A1* | 3/2017 | Zhang | H01L 33/52 |
| 2018/0038581 | A1 | 2/2018 | Nolan et al. | |

FOREIGN PATENT DOCUMENTS

| | | |
|---|---|---|
| CN | 101189543 A | 5/2008 |
| CN | 201599583 U | 10/2010 |
| CN | 101988631 A | 3/2011 |
| CN | 102518964 A | 6/2012 |
| CN | 102520571 A | 6/2012 |
| CN | 102734659 A | 10/2012 |
| CN | 102792094 A | 11/2012 |
| EP | 2461087 A1 | 6/2012 |
| KR | 20090025130 A | 3/2009 |
| TW | 200743223 A | 11/2007 |
| WO | 2006129220 A1 | 12/2006 |
| WO | 2011112914 A2 | 9/2011 |
| WO | 2012176117 A1 | 12/2012 |

OTHER PUBLICATIONS

Jurik, Pavel, et al.; U.S. Appl. No. 14/155,178, filed Jan. 14, 2014; Title: Homogenization System for an LED Luminaire; 25 pages.
Notice of Allowance dated May 12, 2016; U.S. Appl. No. 14/682,853, filed Apr. 9, 2015; 8 pages.
Notice of Allowance dated May 19, 2017; U.S. Appl. No. 14/682,853, filed Apr. 9, 2015; 8 pages.
Corrected Notice of Allowance dated Aug. 25, 2017; U.S. Appl. No. 14/682,853, filed Apr. 9, 2015; 5 pages.
Office Action dated Jan. 11, 2018; U.S. Appl. No. 15/823,215, filed Nov. 27, 2017; 6 pages.
Notice of Allowance dated Jun. 26, 2018; U.S. Appl. No. 15/823,215, filed Nov. 27, 2017; 16 pages.
Office Action dated Feb. 19, 2019; U.S. Appl. No. 16/153,313, filed Oct. 5, 2018; 12 pages.
Notice of Allowance dated Apr. 8, 2019; U.S. Appl. No. 16/153,313, filed Oct. 5, 2018; 11 pages.
PCT International Search Report; Application No. PCT/US2014/011521; Sep. 4, 2014; 4 pages.
PCT Written Opinion of the International Searching Authority; Application No. PCT/US2014/011521; dated Sep. 4, 2014; 6 pages.
Chinese Office Action; Application No. 201480014536.7; dated Apr. 28, 2016; 10 pages.
Chinese Office Action; Application No. 201480014536.7; dated Aug. 3, 2017; 10 pages.
Chinese Office Action; Application No. 201480014536.7; dated Mar. 19, 2018; 9 pages.
Chinese Office Action; Application No. 201480014536.7; dated Mar. 13, 2019; 11 pages.
Chinese Decision of Re-Examination; Application No. 201480014536.7; dated Aug. 28, 2019; 15 pages.
European Examination Report; Application No. 14716041.0; dated Mar. 7, 2017; 6 pages.
European Examination Report; Application No. 14716041.0; dated Mar. 26, 2018; 6 pages.
European Examination Report; Application No. 14716041.0; dated Feb. 7, 2019; 5 pages.
European Examination Report; Application No. 14716041.0; dated Nov. 11, 2019; 5 pages.
Chinese Office Action; Application No. 201911288507.0; dated Sep. 30, 2020; 15 pages.

* cited by examiner

HOMOGENIZATION SYSTEM FOR AN LED LUMINAIRE

CROSS-REFERENCE TO RELATED APPLICATIONS

This application claims priority to U.S. Provisional Application No. 62/826,544, filed Mar. 29, 2019, by Pavel Jurik, et al. entitled, "Homogenization System for an LED Luminaire", which is incorporated by reference herein as if reproduced in its entirety.

FIELD OF DISCLOSURE

The present disclosure generally relates to a method for controlling the light output from an array of lighting emitting diodes (LEDs) when used in a light beam producing luminaire, specifically to a method relating to combining multiple colors of LED into a single homogenized light beam.

BACKGROUND

High power LEDs are commonly used in luminaires, for example, in the architectural lighting industry in stores, offices, and businesses as well as in the entertainment industry in theatres, television studios, concerts, theme parks, night clubs, and other venues. These LEDs are also being utilized in automated lighting luminaires with automated and remotely controllable functionality. For color control it is common to use an array of LEDs of different colors. For example, a common configuration is to use a mix of red, green, and blue LEDs. This configuration allows the user to create the color they desire by mixing appropriate levels of the three colors. For example, illuminating the red and green LEDs while leaving the blue extinguished will result in an output that appears yellow. Similarly, red and blue will result in magenta, and blue and green will result in cyan. By judicious control of these three controls the user may achieve nearly any color they desire. More than three colors may also be used and it is well known to add amber, cyan, or royal blue LEDs to the red, green, and blue to enhance the color mixing and improve the gamut of colors available.

The differently colored LEDs may be arranged in an array in the luminaire where there is physical separation between each LED. This separation, coupled with differences in die size and placement for each color, may affect the spread of the individual colors and results in objectionable spill light and color fringing of the combined mixed color output beam. It is common to use a lens or other optical device in front of each LED to control the beam shape and angle of the output beam; however, these optical devices commonly have differing effect for different colors and color fringing or other aberrations may be visible in the output beam. It is also known to use dichroic reflecting filters to combine three single colors of a LED into a beam. However, these systems do not provide means for mixing more than three colors of LEDs. It would be advantageous to have a system which provides good homogenization of more than three colors of LEDs into a single output light beam.

There is a need for a homogenization system for an LED array based luminaire which provides improvements in homogenization for LED systems comprising four or more different colors of LEDs.

SUMMARY

In a first embodiment, a light source includes first, second, and third arrays of light emitting diodes (LEDs) mounted respectively on first, second, and third common substrates and a beam combiner. The LEDs of the first, second, and third arrays of LEDs emit beams whose optical axes are substantially parallel. The first array of LEDs includes first and second sets of LEDs, which produce light of first and second colors, respectively. The second array of LEDs includes third and fourth sets of LEDs, which produce light of third and fourth colors, respectively. The third array of LEDs includes a fifth set of LEDs, which produces light of fifth color. The first, second, and third arrays of LEDs include respectively first, second, and third pluralities of zones. Each zone of each of the first, second, and third pluralities of zones is spatially separated from other zones of its plurality of zones. Each zone of the first plurality of zones includes LEDs from each of the first and second sets of LEDs. Each zone of the second plurality of zones includes LEDs from each of the third and fourth sets of LEDs. Each zone of the third plurality of zones includes LEDs from fifth set of LEDs. The LEDs of each of the first, second, and third pluralities of zones are configured for intensity control independent from intensity control of the LEDs of other zones of the first, second, and third pluralities of zones. The beam combiner is configured to combine light beams from the first, second, and third arrays of LEDs to produce an emitted beam of light and to maintain the optical axes of the light beams from each of the first, second, and third arrays of LEDs as substantially parallel to each other in the emitted beam of light.

In a second embodiment, a luminaire includes a head, a positioning mechanism, coupled to the head and configured to rotate the head in at least one axis of rotation, and a light source, coupled to the head and configured to emit a light beam. The light source includes first, second, and third arrays of light emitting diodes (LEDs) mounted respectively on first, second, and third common substrates and a beam combiner. The LEDs of the first, second, and third arrays of LEDs emit beams whose optical axes are substantially parallel. The first array of LEDs includes first and second sets of LEDs, which produce light of first and second colors, respectively. The second array of LEDs includes third and fourth sets of LEDs, which produce light of third and fourth colors, respectively. The third array of LEDs includes a fifth set of LEDs, which produces light of fifth color. The first, second, and third arrays of LEDs include respectively first, second, and third pluralities of zones. Each zone of each of the first, second, and third pluralities of zones is spatially separated from other zones of its plurality of zones. Each zone of the first plurality of zones includes LEDs from each of the first and second sets of LEDs. Each zone of the second plurality of zones includes LEDs from each of the third and fourth sets of LEDs. Each zone of the third plurality of zones includes LEDs from fifth set of LEDs. The LEDs of each of the first, second, and third pluralities of zones are configured for intensity control independent from intensity control of the LEDs of other zones of the first, second, and third pluralities of zones. The beam combiner is configured to combine light beams from the first, second, and third arrays of LEDs to produce an emitted beam of light and to maintain the optical axes of the light beams from each of the first, second, and third arrays of LEDs as substantially parallel to each other in the emitted beam of light.

BRIEF DESCRIPTION OF THE DRAWINGS

For a more complete understanding of the present disclosure and the advantages thereof, reference is now made to the following description taken in conjunction with the accompanying drawings in which like reference numerals indicate like features and wherein.

DETAILED DESCRIPTION

Embodiments of an improved LED light homogenizer are illustrated in the Figures, like numerals being used to refer to like and corresponding parts of the various drawings.

The present disclosure generally relates to a method for controlling the light output from an array of LEDs when used in a light beam producing luminaire, specifically to a method relating to providing improvements in homogenization for LED systems comprising different colors of LEDs.

Figure 1:
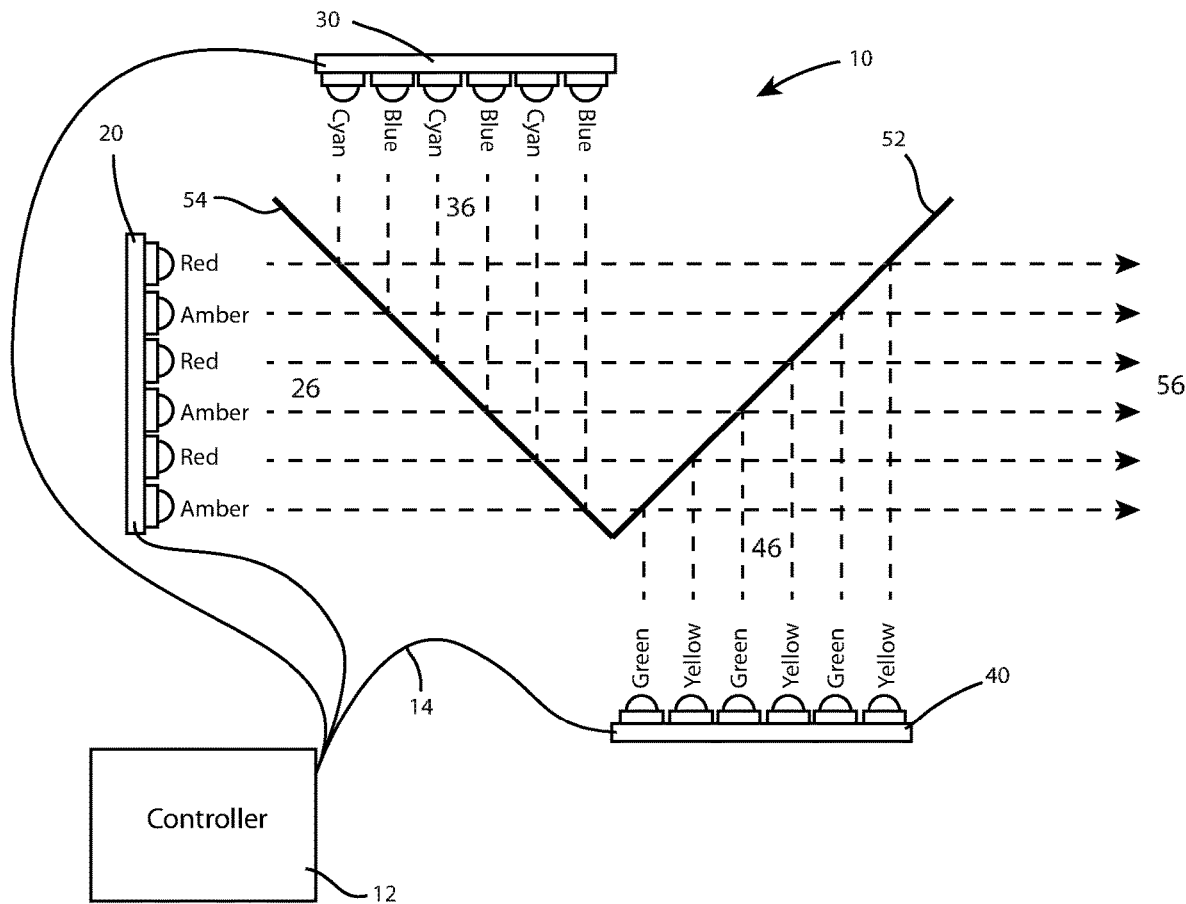
FIG. 1 illustrates an embodiment of an improved LED light homogenizer.

FIG. 1 illustrates a schematic of an embodiment of an improved LED light homogenizer 10. A first LED array 20 may comprise an arrangement of LEDs with discrete longer wavelength peaks such as red and amber LEDs. A second LED array 30 may comprise an arrangement of LEDs with discrete short wavelength peaks such as blue and cyan LEDs. A third LED array 40 may comprise an arrangement of LEDs with discrete midrange wavelength peaks such as yellow and green LEDs. Each array, 20, 30, and 40, may have the associated LEDs arranged in a layout such that the colors are well distributed and mixed across the array. In the embodiment shown, the LED arrays 20, 30, and 40 are controlled by a controller 12, electrically connected by wire 14 to the LED arrays 20, 30, and 40.

In some embodiments, there are a limited number of discrete peak LEDs in an array. For example, in the embodiment illustrated there are two discrete peak types for the three arrays employed: the long wavelength first LED array 20 has red and amber, the short wavelength second LED array 30 has blue and cyan, and the third midrange LED array 40 has green and yellow. In some embodiments all of the LEDs from an array are controlled by the controller 12 as a unit. In other embodiments, the lights of distinct colors are controlled independent of the other distinct colors. For example, in the long bandwidth array, the red LEDs are controlled as a separate color than the amber LEDs.

The red and amber light 26 from first LED array 20 impinges on the rear of dichroic filter 54. Dichroic filter 54 is designed such that it will allow light in red and amber wavelengths to pass through unaffected. In the embodiment illustrated, dichroic filter 54 may be designed as a long pass filter generally letting through wavelengths longer than a certain cut off. In alternative embodiments, this filter may be designed to be a band pass filter that lets discrete long wavelength light through where the band passes match the peak wavelengths of the discrete LEDs in the long wavelength first LED array 20. Lights of other wavelengths are not allowed to pass and are reflected out of the light beam.

The red and amber light transmitted through dichroic filter 54 from first LED array 20 next impinges on the rear of dichroic filter 52. Dichroic filter 52 is also designed such that it will allow light in red and amber wavelengths to pass through unaffected. The characteristics of alternative embodiments of dichroic filter 52 are further discussed below. But, with respect to the red and amber light, dichroic filter 52 acts either a long pass or a band pass for the longer red and amber wavelengths. Thus, the red and amber light 26 from first LED array 20 will exit in emitted light beam 56.

The blue and cyan light 36 from second LED array 30 impinges on the front of dichroic filter 54. As previously described, dichroic filter 54 is designed as a long pass filter (or discrete long bands pass) and therefore it will reflect light in shorter blue and cyan wavelengths.

The blue and cyan light from second LED array 30 impinges on the rear of dichroic filter 52. As previously described, dichroic filter 52 allows passage of long wavelengths. Dichroic filter 52 is also designed to allow passage of short wavelengths such that it will allow light in blue and cyan wavelengths to pass through unaffected. Thus, the blue and cyan light 36 from second LED array 30 will also exit in light beam 56, superimposed on any red and amber light from first LED array 20.

The green and yellow light 46 from third LED array 40 impinges on the front of dichroic filter 52. Dichroic filter 52 is designed such that it will reflect light in the midrange of the color spectrum, thus reflecting rather than transmitting green and yellow wavelengths. Thus, the green and yellow light 46 from third LED array 40 will also exit in emitted light beam 56, superimposed on any red and amber light from first LED array 20 and any blue and cyan light from second LED array 30.

Thus, by selective transmission and reflection by dichroic filters 52 and 54, all colors of LED: red, amber, blue, cyan, green, and yellow, are combined, homogenized and superimposed into a single emitted light beam 56. The dichroic filters 52 and 54 comprise a beam combiner configured to combine the light 26, 36, and 46 emitted by the LED arrays 20, 30, and 40, respectively, into the single emitted light beam 56.

The example shown here utilizes six colors of LED: red, amber, blue, cyan, green, and yellow, however, the disclosure is not so limited and other mixes of LED colors are possible without departing from the spirit of the disclosure. For example, a royal blue LED could be utilized instead of, or as well as, the cyan LED on second LED array 30. For each choice of LEDs on the arrays a corresponding design change must be considered for the dichroic filters so that they reflect and/or transmit the appropriate light wavelengths.

Figure 2:
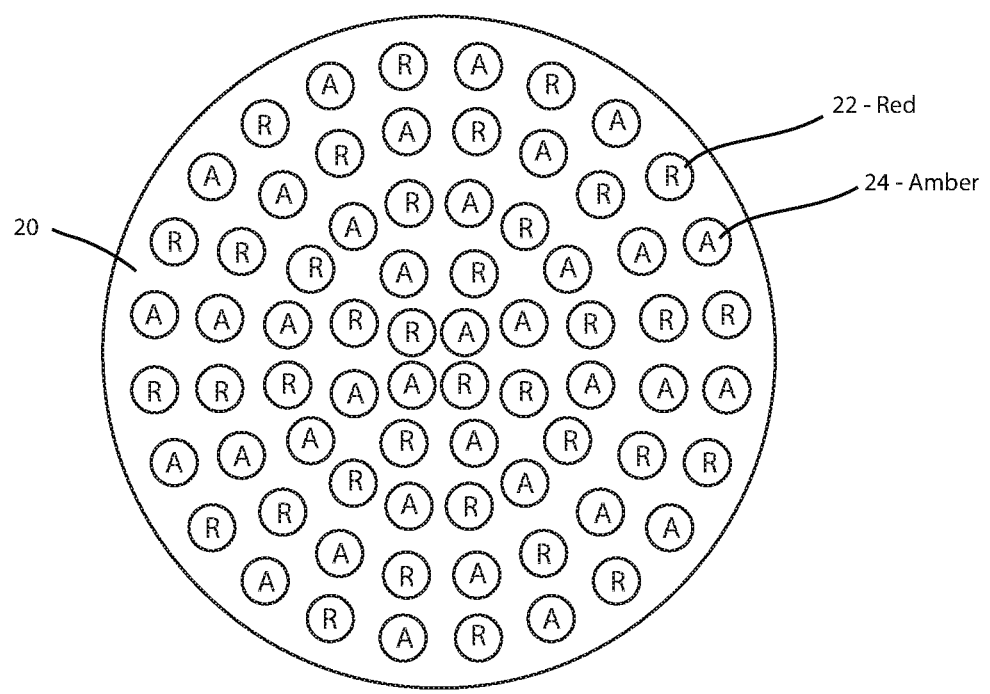
FIG. 2 illustrates an embodiment of a first LED array of the LED light homogenizer illustrated in FIG. 1.

FIG. 2 illustrates an embodiment of a first LED array 20 of the LED light homogenizer illustrated in FIG. 1. In this embodiment, a plurality of red LEDs 22 and a plurality of amber LEDs 24 are distributed across first LED array 20. The arrangement and numbers of each of the red and amber LEDs may be chosen such as to optimize the mix and balance of the two colors. For example, if the amber LEDs are twice as powerful (or twice as bright) as the red LEDs, it may only be necessary to have half the number of amber as red. In that instance, the array would comprise two-thirds red LEDs 22 and one-third amber LEDs 24. The first LED array 20 illustrated is circular, however the disclosure is not so limited and the first LED array 20 may be any shape chosen from, but not limited to, circular, square, rectangular, hexagonal, or octagonal.

Figure 3:
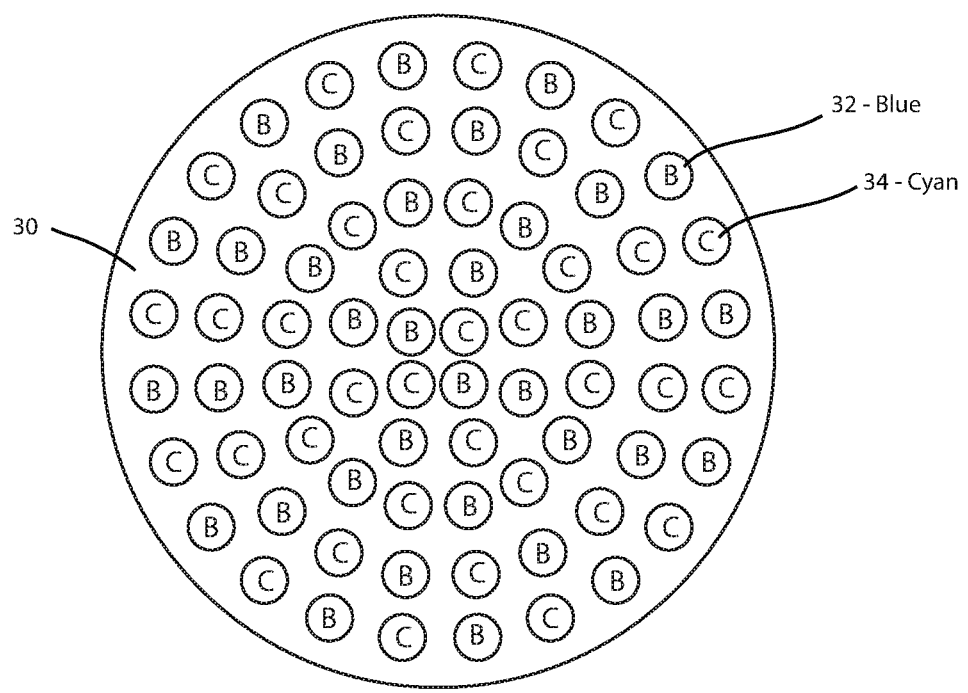
FIG. 3 illustrates an embodiment of a second LED array of the LED light homogenizer illustrated in FIG. 1.

FIG. 3 illustrates an embodiment of a second LED array 30 of the LED light homogenizer illustrated in FIG. 1. In this embodiment, a plurality of blue LEDs 32 and a plurality of cyan LEDs 34 are distributed across second LED array 30. The arrangement and numbers of each of the blue and cyan LEDs may be chosen such as to optimize the mix and balance of the two colors. The second LED array 30 illustrated is circular, however the disclosure is not so limited and the second LED array 30 may be any shape chosen from, but not limited to, circular, square, rectangular, hexagonal, or octagonal.

Figure 4:
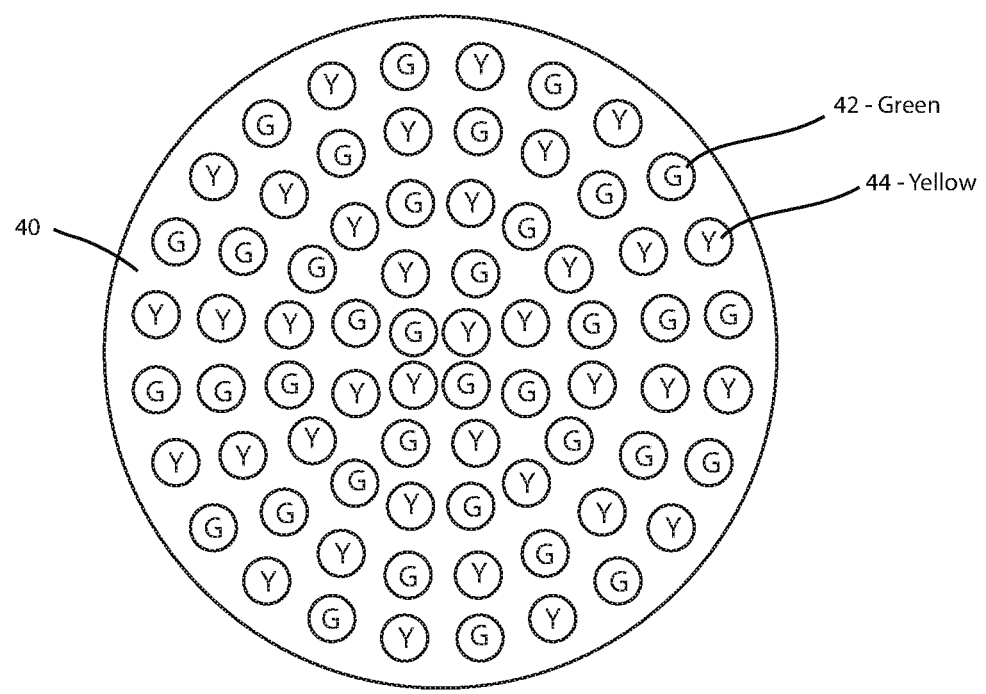
FIG. 4 illustrates an embodiment of a third LED array of the LED light homogenizer illustrated in FIG. 1.

FIG. 4 illustrates an embodiment of a third LED array 40 of the LED light homogenizer illustrated in FIG. 1. In this embodiment, a plurality of green LEDs 42 and a plurality of yellow LEDs 44 are distributed across third LED array 40. The arrangement and numbers of each of the green and yellow LEDs may be chosen such as to optimize the mix and balance of the two colors. The third LED array 40 illustrated is circular, however the disclosure is not so limited and third LED array 40 may be any shape chosen from, but not limited to, circular, square, rectangular, hexagonal, or octagonal.

Figure 5A:
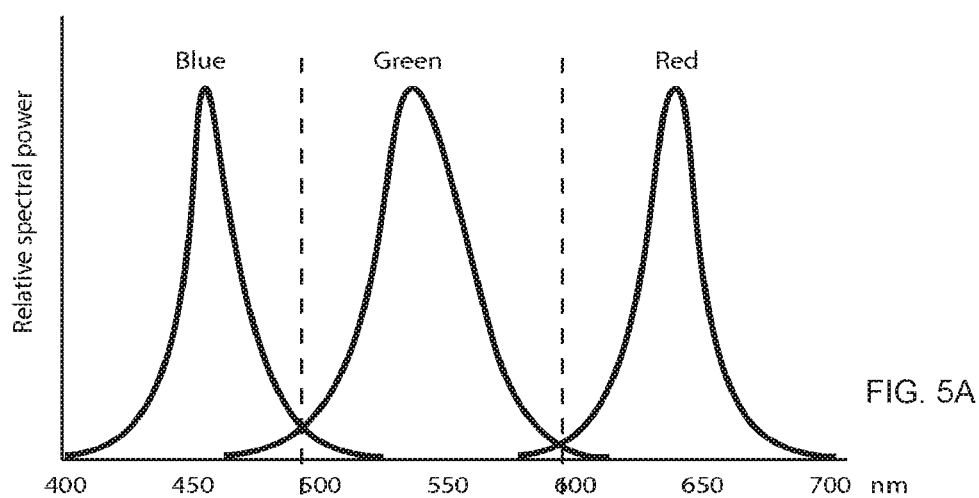
FIGS. 5A-5C illustrate the prior art use of transmissive/reflective dichroic filters in both homogenizers and beam splitters.
Figure 5B:
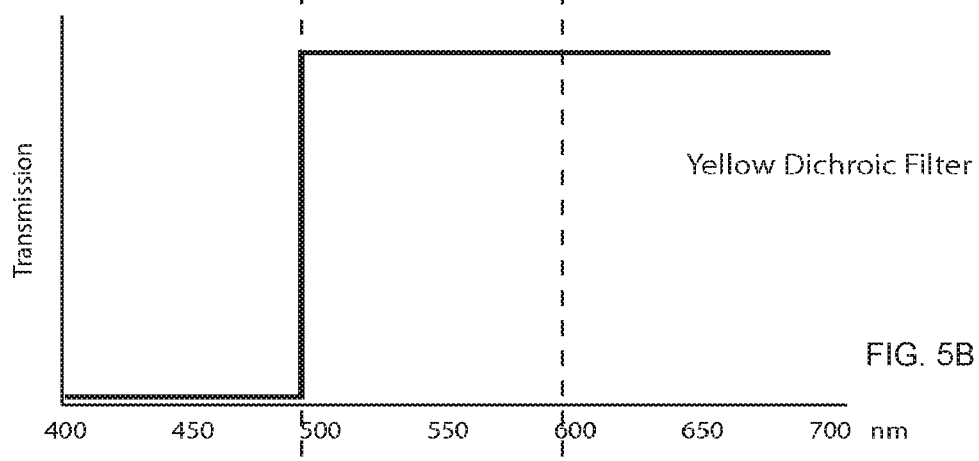
Figure 5C:
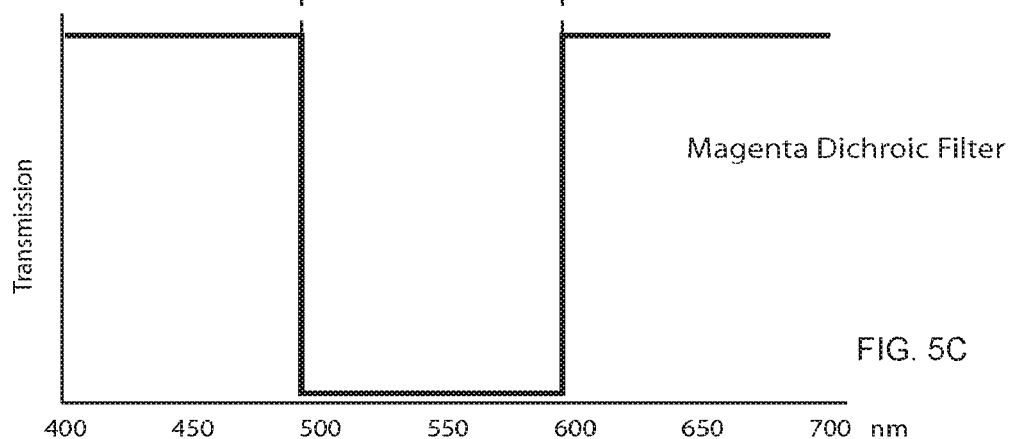

FIGS. 5A-5C illustrate the prior art use of transmissive/reflective dichroic filters in both homogenizers and beam splitters. Such arrangements of dichroic filters are commonly used to both combine light and to split light for video cameras into their red, green, and blue components. FIG. 5A shows the relative spectral power distributions (SPD) of the light emitted by red, green, and blue LEDs with discrete wavelength peaks. It can be seen that the blue LED peaks at around 450 nanometers ("nm"), the green at 550 nm, and the red at 650 nm. The yellow dichroic filter illustrated in FIG. 5B has a filter characteristic such that it allows the red, 650 nm, and green, 550 nm, light to pass unimpeded, while reflecting the blue, 450 nm. Such a filter would appear yellow to the eye. Similarly, the magenta dichroic filter illustrated in FIG. 5C has a filter characteristic such that it allows the red, 650 nm, and blue, 450 nm, light to pass unimpeded, while reflecting the green, 550 nm. Such a filter would appear magenta to the eye. These two filters may be used in a layout similar to that shown in FIG. 1 as dichroic filters 52 and 54 so as to combine the output of red, green, and blue LEDs. However, these filters would not allow us to add in amber, cyan, and yellow LEDs.

Figure 6A:
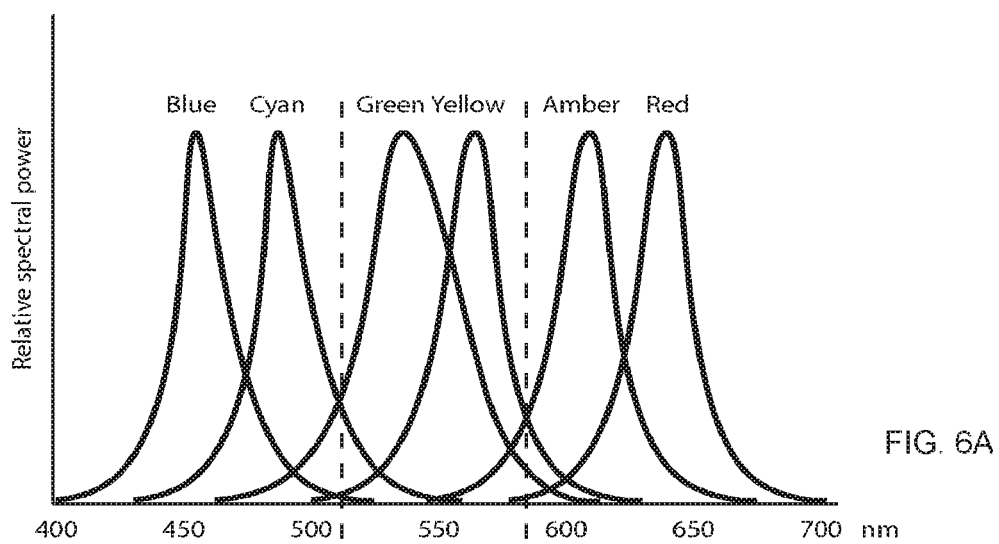
FIGS. 6A-6C illustrate the improved use of transmissive/reflective dichroic filters in the embodiment of the LED light homogenizer illustrated in FIG. 1 and/or FIG. 8.
Figure 6B:
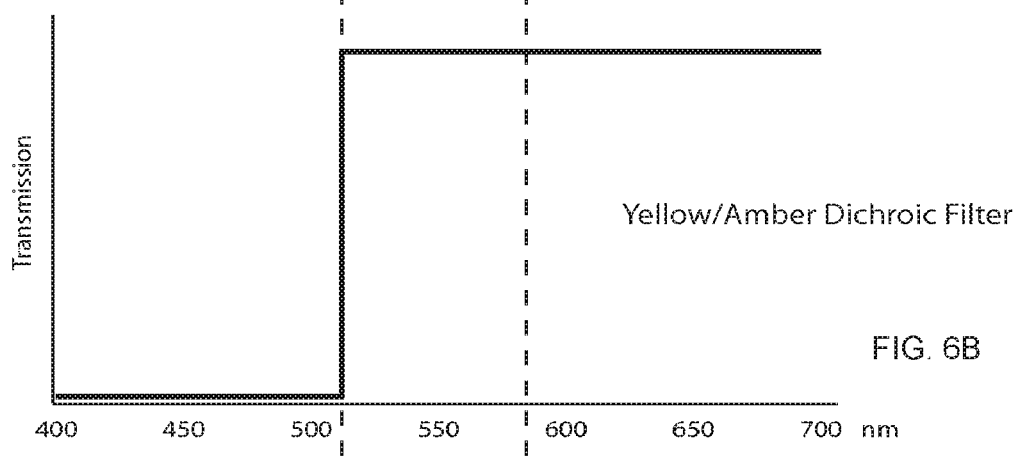
Figure 6C:
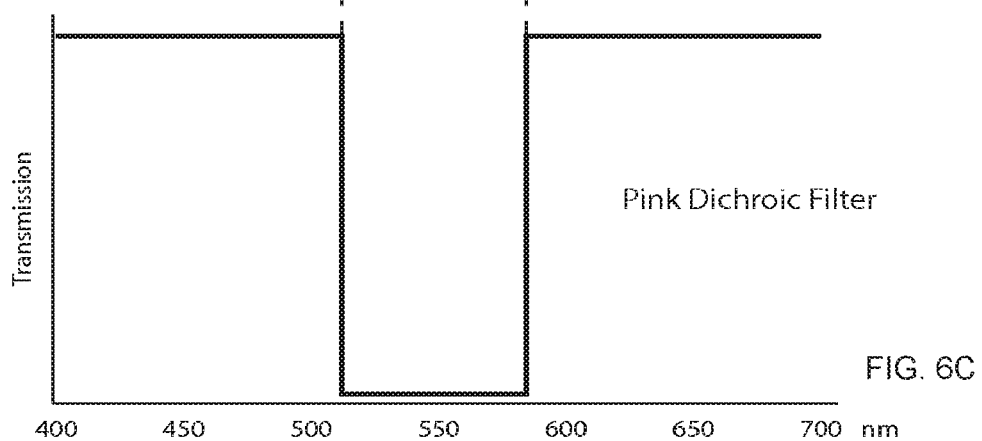
Figure 8:
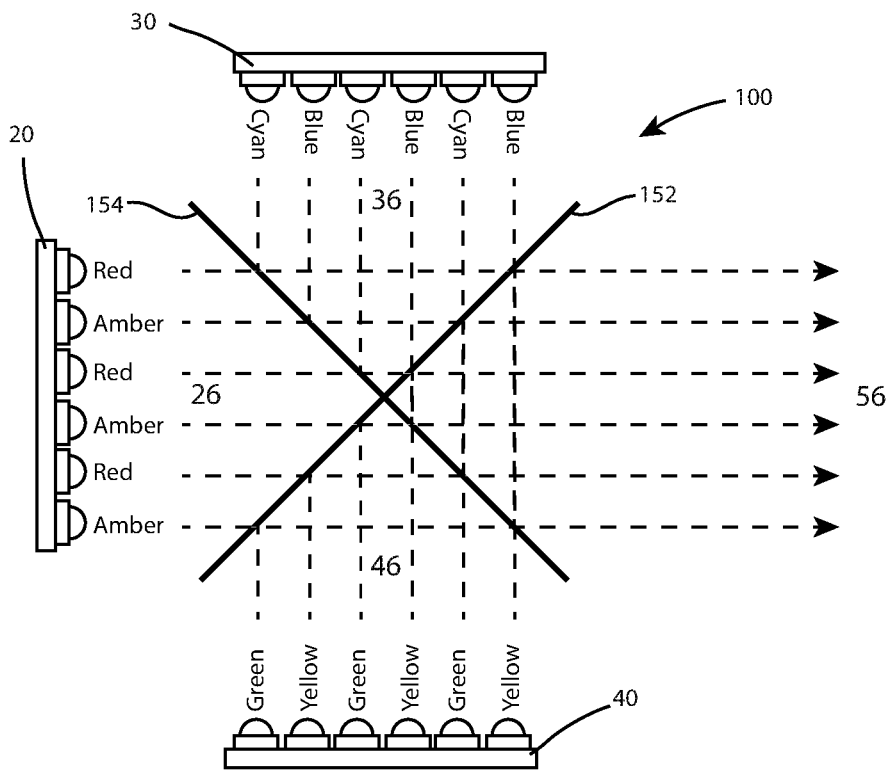
FIG. 8 illustrates an alternative embodiment of an improved LED light homogenizer.

FIGS. 6A-6C illustrate the improved use of transmissive/reflective dichroic filters in the embodiment of the LED light homogenizer illustrated in FIG. 1 and/or FIG. 8. FIG. 6A shows the relative spectral power distributions (SPD) of the light emitted by an embodiment of the disclosure utilizing red, amber, green, yellow, blue, and cyan LEDs. It can be seen that the LEDs have discrete wavelength peaks with a blue LED peak at around 450 nm, the cyan at 475 nm, the green at 550 nm, the yellow at 575 nm, the amber at 625 nm, and the red at 650 nm. The yellow/amber dichroic filter illustrated in FIG. 6B has a filter characteristic such that it allows the red 650 nm, amber, 625 nm, yellow 575 nm, and green 550 nm, light to pass unimpeded, while reflecting the blue 450 nm and cyan 475 nm. Such a filter would appear yellow/amber to the eye. Similarly, the pink dichroic filter illustrated in FIG. 6C has a filter characteristic such that it allows the red, 650 nm, amber 625 nm, cyan 475 nm, and blue 450 nm, light to pass unimpeded, while reflecting the yellow 575 nm, and green, 550 nm. Such a filter would appear pink to the eye. These two filters may be used in FIG. 1 as dichroic filters 52 and 54 so as to combine the output of red, amber, green, yellow, blue, and cyan LEDs.

Figure 7A:
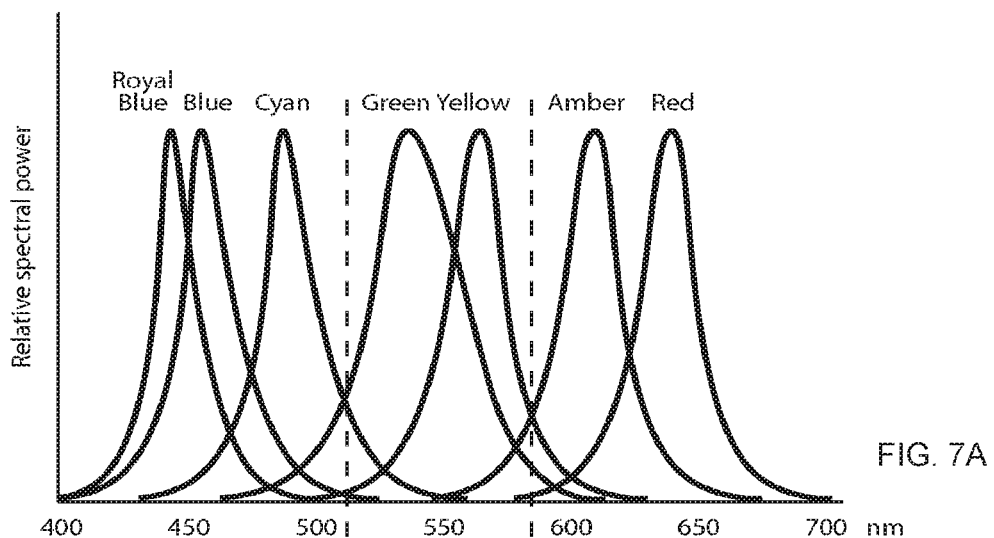
FIGS. 7A-7C illustrate an alternative embodiment of the improved light homogenizer.
Figure 7B:
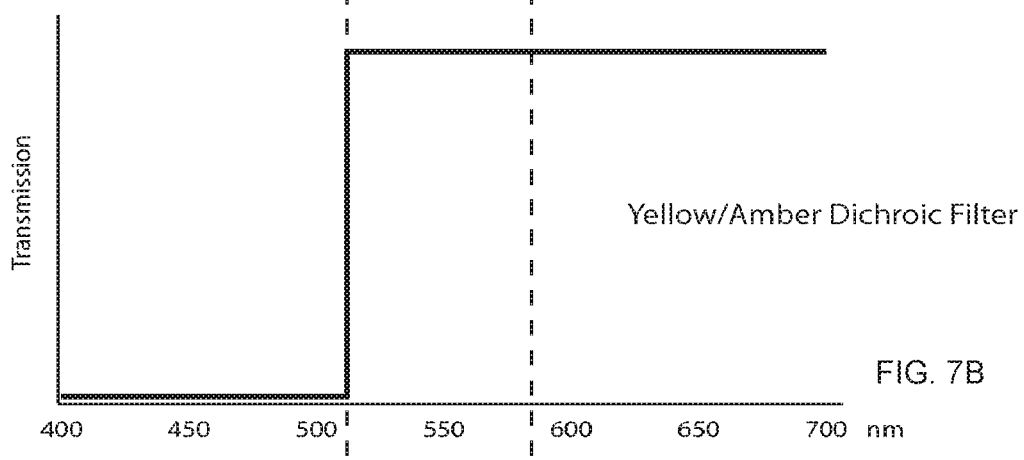
Figure 7C:
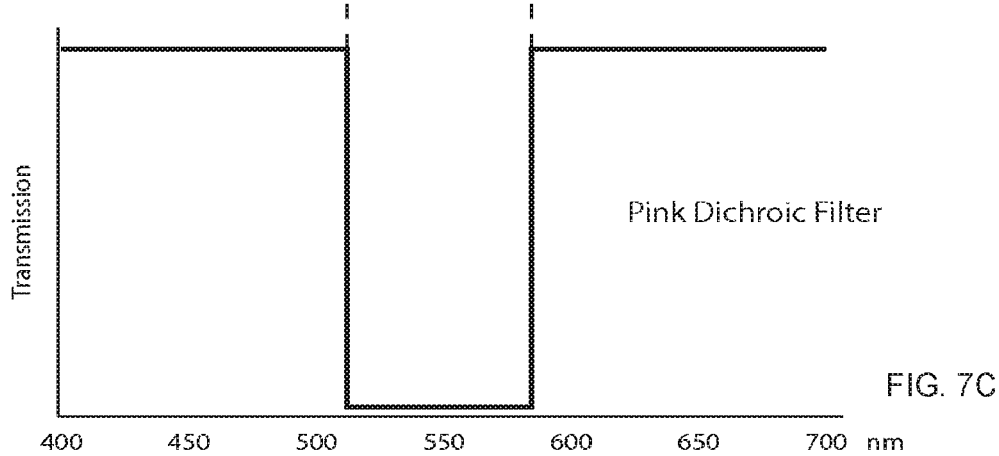

FIGS. 7A-7C illustrate an alternative embodiment of the improved light homogenizer. FIG. 7A illustrates an alternative embodiment extended to include further colors of LEDs. In this embodiment a royal blue LED of wavelength 440 nm has been added to second LED array 30. The appropriate filter characteristics of the dichroic filters to utilize this color are shown in FIGS. 7B and 7C.

FIG. 8 illustrates an alternative embodiment of an improved LED light homogenizer 100. In the embodiment shown, dichroic filters 152 and 154 have been arranged in a crossed arrangement as opposed to the serial arrangement shown in FIG. 1. This layout reduces the overall length of the assembly.

Figure 9:
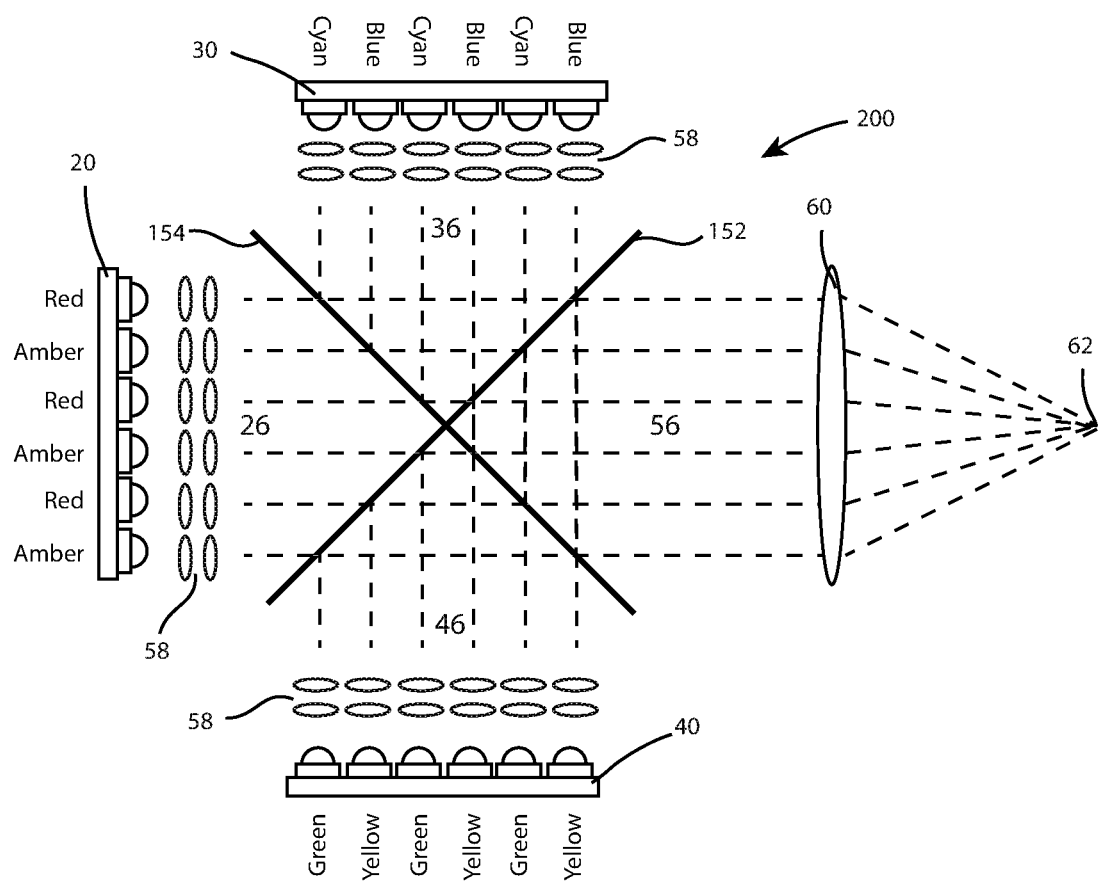
FIG. 9 illustrates a further embodiment of an improved LED light homogenizer.

The embodiments illustrated in FIG. 1, FIG. 8, and FIG. 9 show the red and amber emitters of first LED array 20 at the rear with blue and cyan of the second LED array 30 on one side and yellow and green of the third LED array 40 on the other, however it should be understood that this layout is a single example of possible arrangements of the light emitters of the disclosure and that in further embodiments, the LED emitters are arranged differently. For example, in alternative embodiments, the green and yellow LEDs of the third LED array 40 may be located at the rear where the red and amber LEDs of the first LED array 20 are illustrated in the Figures. Of course the configuration of the dichroic filters/mirrors 52, 54 and/or 152, 154 will have to match the configuration of the LEDs so that the desired colors pass into emitted light beam 56 in the case of the rear LED array and reflect in the direction of emitted light beam 56 in the case of the side LED arrays.

As for the LED light homogenizer 10, selective transmission and reflection by dichroic filters 152 and 154 of the LED light homogenizer 100 causes all colors of LED: red, amber, blue, cyan, green, and yellow, to be combined, homogenized and superimposed into a single emitted light beam 56. The dichroic filters 152 and 154 comprise a beam combiner configured to combine the light 26, 36, and 46 emitted by the LED arrays 20, 30, and 40, respectively, into the single emitted light beam 56.

FIG. 9 illustrates a further embodiment of an improved LED light homogenizer 200 and adds controlling optics to the system. Each LED may have a collimating optical system 58 which serves to collimate and direct the light beam through the dichroic filters 152 and 154. The system may also have focusing and homogenizing optics 60 which may focus the exiting light beam 56 to a focal point 62. Focusing and homogenizing optics 60 may include optical elements selected from, but not restricted to, optical diffuser, holographic diffuser, non-Gaussian diffuser, integrating rod of any cross section, integrating tunnel of any cross section, or other optical means of homogenizing or mixing light as is well known in the art. Focusing and homogenizing optics 60 may further include optical elements selected from, but not restricted to, a single positive or negative lens, or multiple lenses arranged in one or more optical groups. Such an optical system may have movable elements such that the focal length of the focusing and homogenizing optics 60 is adjustable. The focusing and homogenizing optical system 60 may also include field stops, apertures, gates, gobos, and other optical devices well known in the art.

The control of the filter characteristics of dichroic filters 52 and 54 is critical for the disclosure. The filters must be carefully manufactured such that their pass bands match the wavelengths of the LEDs utilized. The wavelength responses of the filters shown in FIG. 6 are shown very simplistically. In practice the response is not nearly so square or abrupt. Additionally, the response is shown generically so that it would work for both the embodiments illustrated in FIG. 1 as well as the embodiments illustrated in FIG. 8 and FIG. 9. The generalized response shows a cut-off length at around 500 nm for the yellow dichroic filter which corresponds with dichroic filter 54 in FIG. 1 and 154 in FIG. 8 and FIG. 9. However, in other embodiments the cut-off length could be designed to be closer to 600 nm for dichroic filter 54 in FIG. 1.

By way of the exemplary embodiments of FIG. 1, dichroic filter 54 should be designed to both: (1) maximize the reflection of light at the LED peaks at around 450 nm (blue) and around 475 nm (cyan); and (2) maximize the transmission of light at LED peaks at around 625 nm (amber) and around 650 nm (red). Dichroic filter 52 should be designed to both: (1) maximize the reflection of light at the LED peaks at around 550 nm (green) and around 575 nm (yellow); and (2) maximize the transmission of light at LED peaks around 450 nm (blue), around 475 nm (cyan), around 625 nm (amber), and around 650 nm (red).

By way of the exemplary embodiments of FIG. 8, dichroic filter 154 should be designed to both: (1) maximize the reflection of light at the LED peaks at around 450 nm (blue) and around 475 nm (cyan); and (2) maximize the transmission of light at LED peaks at around 550 nm (green), around 575 nm (yellow), around 625 nm (amber), and around 650 nm (red). Dichroic filter 152 should be designed to both: (1) maximize the reflection of light at the LED peaks at around 550 nm (green) and around 575 nm (yellow); and (2) maximize the transmission of light at LED peaks around 450 nm (blue), around 475 nm (cyan), around 625 nm (amber), and around 650 nm (red).

By way of the exemplary embodiments of FIG. 1 with the LED peaks of FIG. 7, dichroic filter 54 should be designed to both: (1) maximize the reflection of light at the LED peaks at around 440 nm (royal blue), around 450 nm (blue), and around 475 nm (cyan); and (2) maximize the transmission of light at LED peaks at around 625 nm (amber) and around 650 nm (red). Dichroic filter 52 should be designed to both: (1) maximize the reflection of light at the LED peaks at around 550 nm (green) and around 575 nm (yellow); and (2) maximize the transmission of light at LED peaks around 440 nm (royal blue), around 450 nm (blue), around 475 nm (cyan), around 625 nm (amber), and around 650 nm (red).

By way of the example embodiments of FIG. 8 with the LED peaks of FIG. 7, dichroic filter 154 should be designed to both: (1) maximize the reflection of light at the LED peaks at around 440 nm (royal blue), around 450 nm (blue), and around 475 nm (cyan); and (2) maximize the transmission of light at LED peaks at around 550 nm (green), around 575 nm (yellow), around 625 nm (amber), and around 650 nm (red). Dichroic filter 152 should be designed to both: (1) maximize the reflection of light at the LED peaks at around 550 nm (green) and around 575 nm (yellow); and (2) maximize the transmission of light at LED peaks at around 440 nm (royal blue), around 450 nm (blue), around 475 nm (cyan), around 625 nm (amber), and around 650 nm (red).

It should be appreciated that in their preferred modes of each of the embodiments described herein, the LED arrays 20, 30, and 40 are controlled by a controller 12 which is connected to the arrays. The connection may be electrical as illustrated in FIG. 1 or may be by wireless communication means for controlling the LEDs' capacity to output light. In a preferred embodiment, the control of the colors as defined by their peak wavelength are controlled independent of the other colors similarly defined and at least one of multiple arrays has multiple such defined colors each independently controllable.

Figure 10:
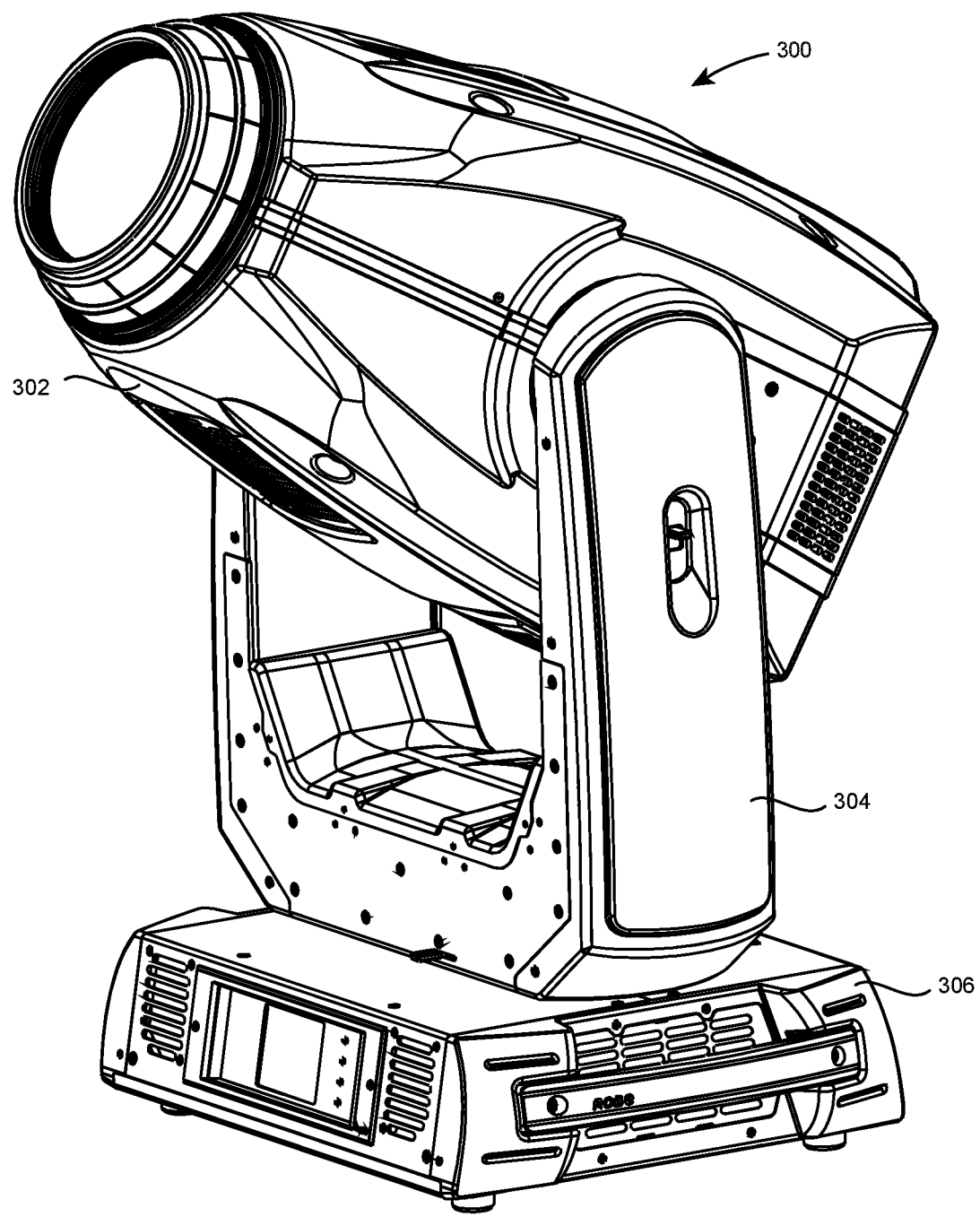
FIG. 10 illustrates an alternative embodiment of an automated luminaire, including an improved LED light homogenizer.

FIG. 10 illustrates an alternative embodiment of an automated luminaire, including an improved LED light homogenizer. Luminaires with automated and remotely controllable functionality are well known in the entertainment and architectural lighting markets. Such products are commonly used in theatres, television studios, concerts, theme parks, nightclubs and other venues. A typical product will provide control over the pan and tilt functions of the luminaire allowing the operator to remotely control the direction the luminaire is pointing, and thus, the position of the light beam on the stage or other space in which it is operational. Typically, this position control is done via control of the luminaire's position in two orthogonal rotational axes commonly referred to as pan and tilt. Many products provide control over other parameters such as the intensity, color, focus, beam size, beam shape and beam pattern. The beam pattern is often provided by a stencil or slide called a gobo which may be a steel, aluminum, or etched glass pattern. The products manufactured by Robe Show Lighting such as the ColorSpot 700E are typical of the art. Automated luminaire 300 may comprise top box 306, yoke 304, and head 302. In this case, the head 302 contains an embodiment of the LED light homogenizer as the light source of the light engine (not shown), but further shown and described below, as well as prior art optical devices such as gobos, shutters, iris, prisms, frost, animation wheel, and other optical devices as is well known in the art. In alternative embodiments, the majority of the optical engine is stationary and the panning and/or tilting positioning of the light beam is accomplished by a gimbaled mirror redirecting the light beam proximate to output end of the light engine. Such embodiment is not shown, but is well known in the art.

Figure 11:
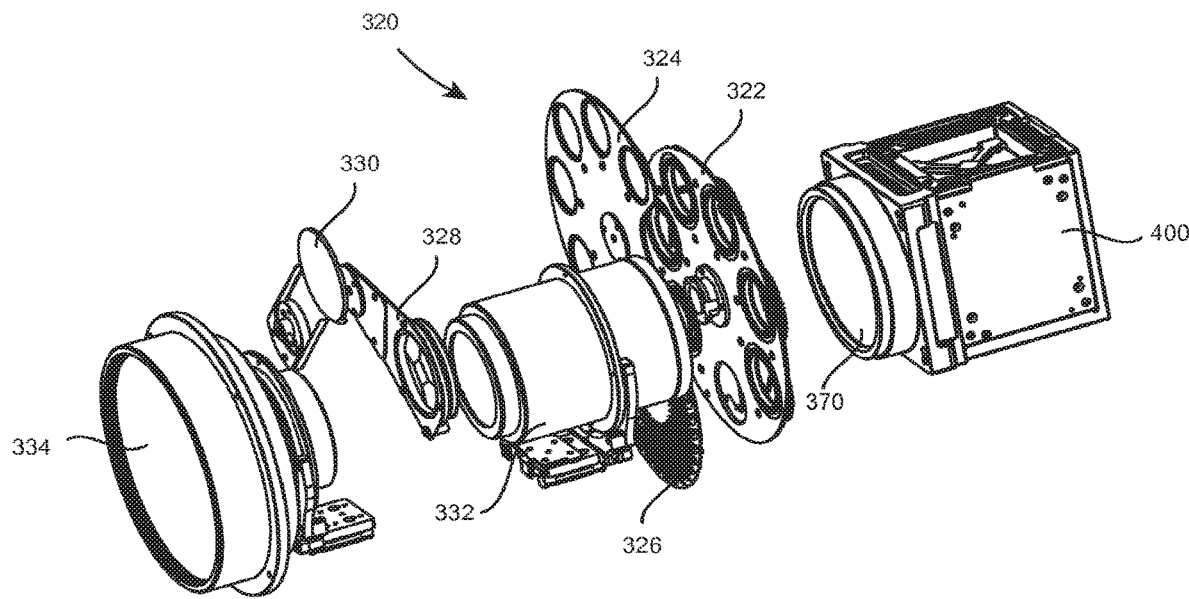
FIG. 11 illustrates the optical engine of an automated luminaire including the improved LED light homogenizer.

FIG. 11 illustrates the optical engine 320 of an automated luminaire 300 shown in FIG. 10 including the improved LED light homogenizer. Light source 400 is an embodiment of the improved light homogenizer. Homogenized light exits light source 400 through source exit optic 370. In the optical engine 320, the light beam then passes through a rotating gobo wheel 322, a stationary gobo wheel 324, an animation wheel 326, a lens system 332, a selectable rotating prism system 328, and a selectable frost system 330, before exiting through final output lens 334. It should be understood that the layout, number, and description of optical devices shown in FIG. 11 is illustrative and that the application of the disclosure is not so specifically constrained. In practice, any number, layout, and type of optical devices may be used in automated luminaire 300 as is well known in the art.

Figure 12:
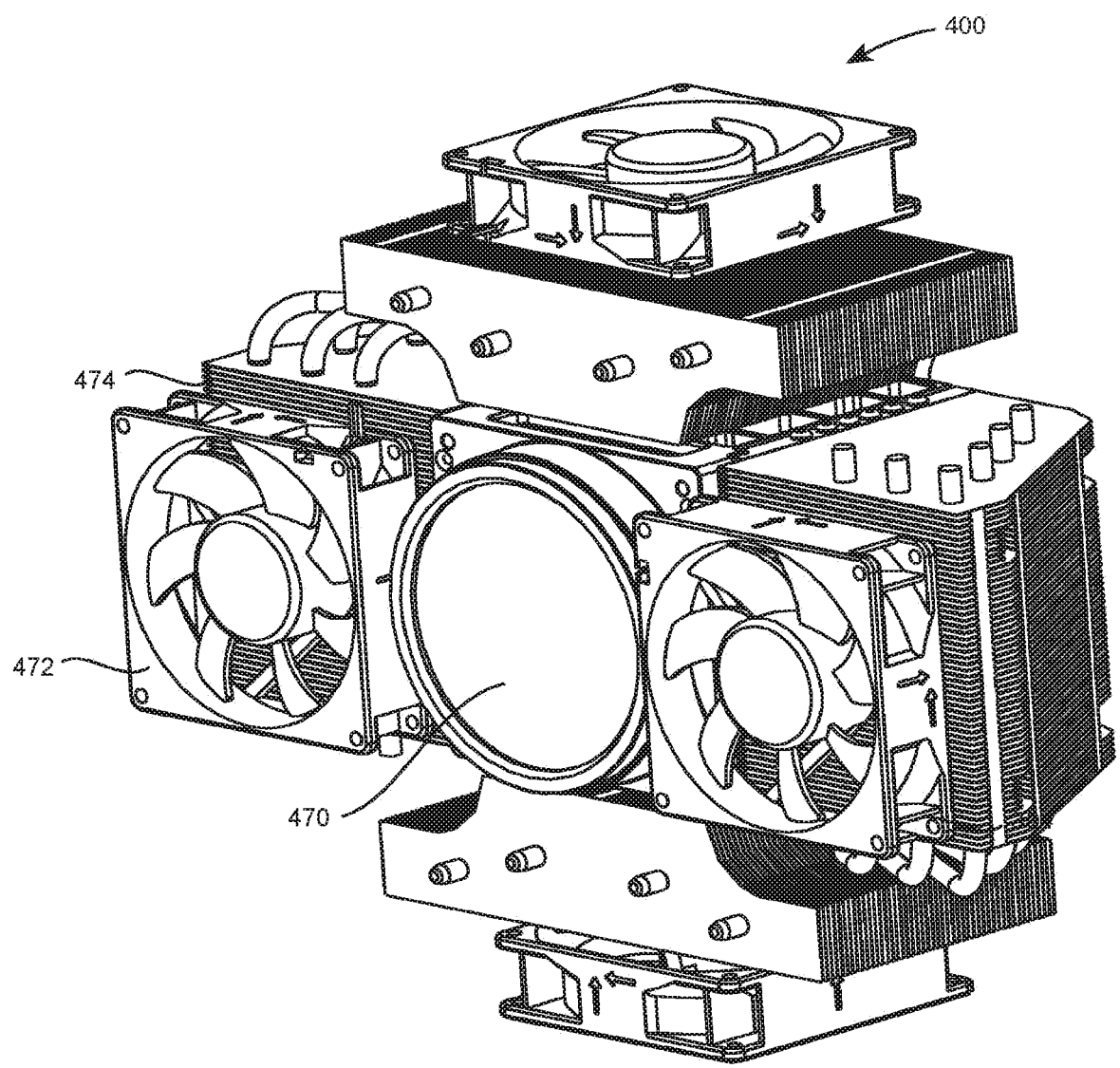
FIG. 12 illustrates a further embodiment of an LED light homogenizer.

FIG. 12 illustrates a further embodiment of an LED light homogenizer, which may be as described in FIG. 9 and used in automated luminaire 300, shown in FIG. 10. Light source 400 comprises an embodiment of the improved light homogenizer along with cooling system(s) 472 and 474. Homogenized light exits light source 400 through exit optic 470.

Figure 13:
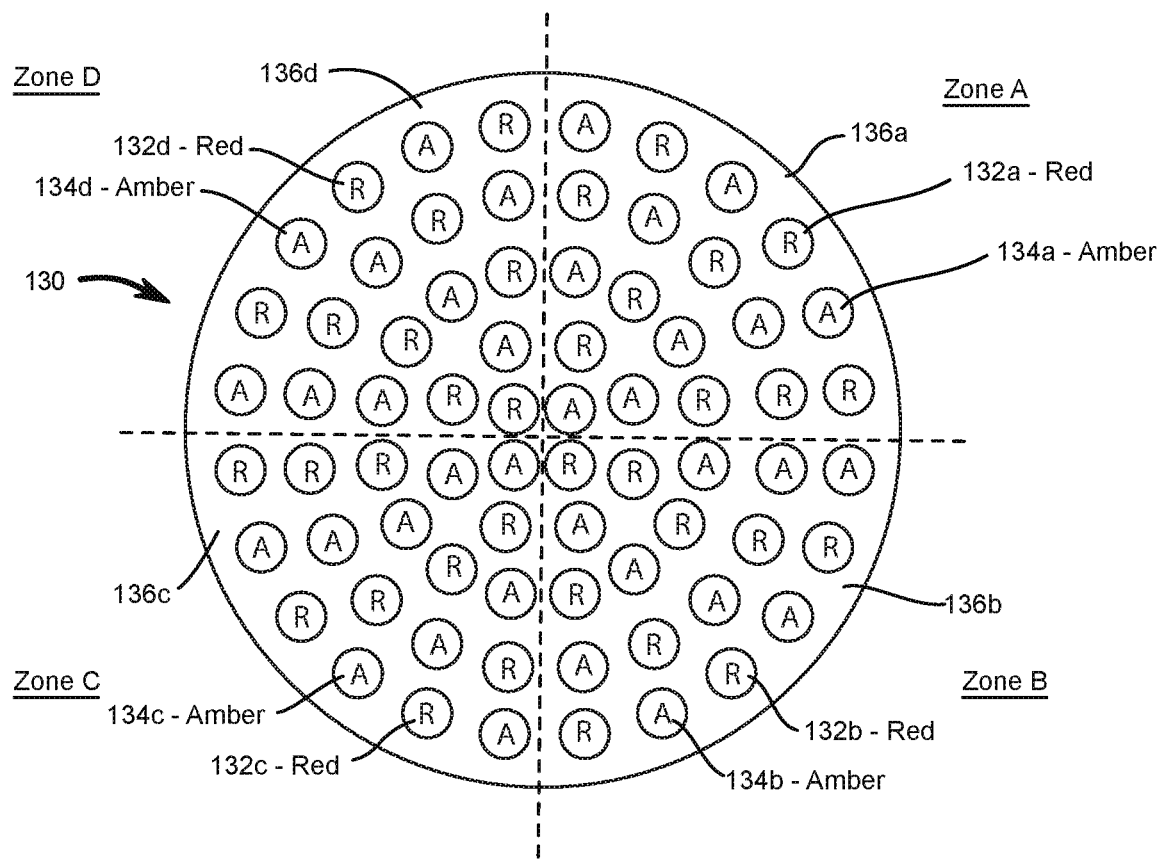
FIG. 13 illustrates a further embodiment of a first LED array of the LED light homogenizer illustrated in FIG. 1.

FIG. 13 illustrates a further embodiment of a first LED array 130 of the LED light homogenizer illustrated in FIG. 1. In this embodiment, a plurality of red LEDs 132a, 132b, 132c, and 132d, and a plurality of amber LEDs 134a, 134b, 134c, and 134d are mounted on a common substrate and distributed across first LED array 130. The arrangement and numbers of each of the red and amber LEDs may be chosen such as to optimize the mix and balance of the two colors. For example, if the amber LEDs are twice as powerful (or twice as bright) as the red LEDs, it may only be necessary to have half the number of amber LEDs as red LEDs. In that instance, the array would comprise two-thirds red LEDs 132a, 132b, 132c, 132d, and one-third amber LEDs 134a, 134b, 134c, 134d. The first LED array 130 illustrated is circular, however the disclosure is not so limited and the first LED array 130 may be any shape chosen from, but not limited to, circular, square, rectangular, hexagonal, or octagonal.

First LED array 130 may be split into a number of spatially separated zones, each of which is powered and controlled independently. For example, FIG. 13 illustrates first LED array 130 split into four zones, Zone A, Zone B, Zone C, and Zone D. As may be seen, the four zones divide the LED array 130 into quadrants. Each of these zones has its corresponding complement of red and amber LEDs. Zone A comprises LED array 136a containing a plurality of red LEDs 132a and a plurality of amber LEDs 134a. Zone B comprises LED array 136b containing a plurality of red LEDs 132b and a plurality of amber LEDs 134b. Zone C comprises LED array 136c containing a plurality of red LEDs 132c and a plurality of amber LEDs 134c. Zone D comprises LED array 136d containing a plurality of red LEDs 132d and a plurality of amber LEDs 134d. Within each zone the red LEDs may be controlled separately from the red LEDs in the other zones and the amber LEDs may be controlled separately from the amber LEDs in the other zones. In the example given, there may be four independently controlled red zones, and four independently controlled amber zones.

In the first LED array 130, the color and intensity in each zone are independently and separately controlled. The aggregate light beam emitted by Zone A may be red only, Zone B may be a first balance of red and amber, Zone C a second balance of red and amber, and Zone D may be amber only. Similarly, whatever the color of each of the zones, the light beam emitted by each zone may have a different intensity, including zero intensity—i.e., a zone may emit no light.

Although the figure shows a first LED array split into four equal circumferential zones, the disclosure is not so limited, and first LED array may be split into any number, any shape, and any arrangement of zones. For example, the zones may form concentric circles around the center of the array or any other arrangement.

Similarly, the second and third LED arrays may also be split into zones with individual control of the zones of colored LEDs arranged in each of those arrays. The number and arrangement of zones may correspond with that chosen for first LED array 130, or may form a different number, shape, or arrangement of zones.

As may be seen in LED light homogenizers 10 and 100, shown in FIGS. 1 and 8, individual LEDs in the LED arrays 20, 30, and 40 emit beams whose optical axes are substantially parallel and which are not substantially altered by dichroic filters 52 and 54 or dichroic filters 152 and 154 in the emitted light beam 56 emitted by LED light homogenizers 10 and 100. That is, the paths of the parallel optical axes of beams are not made non-parallel or intermingled. As used herein, 'substantially parallel' means to within manufacturing tolerances. Indeed, even in LED light homogenizer 200, shown in FIG. 9, the parallel optical axes of the individual LED beams are not substantially altered by the collimating optical systems 58 added to each LED array. It is only when the emitted light beam 56 passes through the focusing and homogenizing optics 60 that the individual LED beams are converged and intermingled.

As such, the separation of LED array 130 into zones results in a corresponding separation of a light beam emitted by the LED array 130 into corresponding zones. As the parallel optical axes of the individual LED beams are not intermingled by the LED light homogenizers 10 and 100, similarly the aggregate beam emitted from each zone of the LED array 130 is not intermingled with the aggregate beams emitted from the other zones when the LED array 130 is used in the LED light homogenizers 10 and 100. That is, the zones in the LED array 130 are preserved in LED light homogenizers according to the disclosure.

As described above, all three LED arrays in an LED light homogenizer according to the disclosure may be split into zones and in such an embodiment the zones from each LED array will be preserved in the beam emitted from the LED light homogenizer. In embodiments where each LED array is divided into quadrants by its zones and the zones of each LED array are oriented to align with the zones of the other LED arrays, the beam emitted from the LED light homogenizer will have quadrants corresponding to the zones of the LED arrays. In such embodiments, the light in any quadrant of the beam emitted from the LED light homogenizer may have colors from one or more of the corresponding zones in each of the LED arrays, may have an intensity that results from light emitted from one or more of the corresponding zones, or may have no light if all three corresponding zones are dark. In such embodiments, sequences of color and/or intensity changes between zones on one or more of the LED arrays will produce corresponding sequences of color and/or intensity changes between zones of the beam emitted from the LED light homogenizer.

It will be understood that in other embodiments, where some of the LED arrays have a number and/or arrangement of zones that is different from the number or arrangement of other LED arrays, the zones from each LED array will still be preserved in the beam emitted from the LED light homogenizer, but the combined effect of such LED arrays' zones will be different from—and in some such embodiments, more complex than—the effect described above for LED arrays having four aligned quadrants. In some such embodiments, an LED array may be divided into eight octants, two of which align with the quadrant zones of another LED array. In other such embodiments, an LED array may be divided into two or more annular arrays.

While the disclosure has been described with respect to a limited number of embodiments, those skilled in the art, having benefit of this disclosure, will appreciate that other embodiments may be devised which do not depart from the scope of the disclosure as disclosed herein. The disclosure has been described in detail, however various changes, substitutions, and alterations can be made hereto without departing from the spirit and scope of the disclosure.

What is claimed is:

1. A light source, comprising:
 a first array of light emitting diodes (LEDs) mounted on a first common substrate, the first array of LEDs:
  emitting beams whose optical axes are substantially parallel,
  comprising first and second sets of LEDs, the first and second sets of LEDs producing light of first and second colors, respectively, and comprising a first plurality of zones, each zone of the first plurality of zones spatially separated from other zones of the first plurality of zones, each zone of the first plurality of zones including LEDs from each of the first and second sets of LEDs, the LEDs of each zone of the first plurality of zones configured for intensity control independent from intensity control of the LEDs of other zones of the first plurality of zones;

a second array of LEDs mounted on a second common substrate, the second array of LEDs:
emitting beams whose optical axes are substantially parallel,
comprising third and fourth sets of LEDs, the third and fourth sets of LEDs producing light of third and fourth colors, respectively,
comprising a second plurality of zones, each zone of the second plurality of zones spatially separated from other zones of the second plurality of zones, each zone of the second plurality of zones including LEDs from each of the third and fourth sets of LEDs, the LEDs of each zone of the second plurality of zones configured for intensity control independent from intensity control of the LEDs of other zones of the second plurality of zones;

a third array of LEDs mounted on a third common substrate, the third array of LEDs:
emitting beams whose optical axes are substantially parallel,
comprising a fifth set of LEDs producing light of a fifth color;
comprising a third plurality of zones, each zone of the third plurality of zones spatially separated from other zones of the third plurality of zones, each zone of the third plurality of zones including LEDs from the fifth set of LEDs, the LEDs of each zone of the third plurality of zones configured for intensity control independent from intensity control of the LEDs of other zones of the third plurality of zones; and a beam combiner configured to combine light beams from the first, second, and third arrays of LEDs to produce an emitted beam of light, the beam combiner configured to maintain the optical axes of the light beams from each of the first, second, and third arrays of LEDs as substantially parallel to each other in the emitted beam of light, the emitted beam of light comprising a fourth plurality of zones, each zone in the fourth plurality of zones of the emitted beam of light comprising superimposed light from one zone in each of the first, second, and third pluralities of zones.

2. The light source of claim 1, wherein each of the first, second, and third arrays of LEDs comprises four zones dividing the arrays of LEDs into quadrants.

3. The light source of claim 2, wherein the four zones of each of the first, second, and third arrays of LEDs are aligned with corresponding zones in each of the other two arrays of LEDs.

4. The light source of claim 1, wherein an intensity of light emitted from the LEDs of the first set of LEDs is independently controllable from an intensity of light emitted from the LEDs of the second set of LEDs.

5. The light source of claim 1, wherein the LEDs of the first set of LEDs are physically interspersed on the first common substrate with LEDs of the second set of LEDs.

6. The light source of claim 5, wherein a first number of LEDs in the first set of LEDs and a second number of LEDs in the second set of LEDs are based on a ratio of brightness between the LEDs in the first set of LEDs to the LEDs in the second set of LEDs.

7. A luminaire comprising:
a head;
a positioning mechanism, coupled to the head and configured to rotate the head in at least one axis of rotation; and
a light source, coupled to the head and configured to emit a light beam, the light source comprising:
a first array of light emitting diodes (LEDs) mounted on a first common substrate, the first array of LEDs:
emitting beams whose optical axes are substantially parallel,
comprising first and second sets of LEDs, the first and second sets of LEDs producing light of first and second colors, respectively, and
comprising a first plurality of zones, each zone of the first plurality of zones spatially separated from other zones of the first plurality of zones, each zone of the first plurality of zones including LEDs from each of the first and second sets of LEDs, the LEDs of each zone of the first plurality of zones configured for intensity control independent from intensity control of the LEDs of other zones of the first plurality of zones;

a second array of LEDs mounted on a second common substrate, the second array of LEDs:
emitting beams whose optical axes are substantially parallel,
comprising third and fourth sets of LEDs, the third and fourth sets of LEDs producing light of third and fourth colors, respectively,
comprising a second plurality of zones, each zone of the second plurality of zones spatially separated from other zones of the second plurality of zones, each zone of the second plurality of zones including LEDs from each of the third and fourth sets of LEDs, the LEDs of each zone of the second plurality of zones configured for intensity control independent from intensity control of the LEDs of other zones of the second plurality of zones;

a third array of LEDs mounted on a third common substrate, the third array of LEDs:
emitting beams whose optical axes are substantially parallel,
comprising a fifth set of LEDs producing light of a fifth color;
comprising a third plurality of zones, each zone of the third plurality of zones spatially separated from other zones of the third plurality of zones, each zone of the third plurality of zones including LEDs from the fifth set of LEDs, the LEDs of each zone of the third plurality of zones configured for intensity control independent from intensity control of the LEDs of other zones of the third plurality of zones; and a beam combiner configured to combine light beams from the first, second, and third arrays of LEDs to produce an emitted beam of light, the beam combiner configured to maintain the light beams from each of the first, second, and third arrays of LEDs as substantially parallel to each other in the emitted beam of light, the emitted beam of light comprising a fourth plurality of zones, each zone in the fourth plurality of zones of the emitted beam of light comprising superimposed light from one zone in each of the first, second, and third pluralities of zones.

8. The luminaire of claim 7, wherein the LEDs of the first set of LEDs are physically interspersed on the first common substrate with LEDs of the second set of LEDs.

9. The luminaire of claim 7, further comprising first, second, and third collimating optical systems each optically coupled with an associated one of the first, second, and third arrays of LEDs, wherein each collimating optical system is configured to collimate the light beam from the LEDs of the associated array of LEDs while maintaining the optical axes of the light beams from the LEDs of the associated array of LEDs as substantially parallel to each other.

10. The luminaire of claim 7, wherein the at least one axis of rotation is a first axis of rotation and the positioning mechanism is further configured to rotate the head in a second axis of rotation, the second axis of rotation being orthogonal to the first axis of rotation.

11. The luminaire of claim 7, further comprising a cooling system thermally coupled to the light source and configured to remove heat generated by the light source.

12. The luminaire of claim 7, further comprising a controller electronically coupled to the first, second, third, fourth, and fifth sets of LEDs and configured to individually control a brightness of at least one of the first, second, third, fourth, and fifth sets of LEDs.

13. The luminaire of claim 12, wherein the controller is configured to individually control a brightness of (i) LEDs from each of the first and second sets of LEDs in each of the first plurality of zones, (ii) LEDs from each of the third and fourth sets of LEDs in each of the second plurality of zones, and (iii) LEDs from the fifth set of LEDs in each of the third plurality of zones.

* * * * *